(12) United States Patent
Cheng et al.

(10) Patent No.: US 12,274,172 B2
(45) Date of Patent: Apr. 8, 2025

(54) PIEZOELECTRIC ACTUATING APPARATUS

(71) Applicant: Coretronic MEMS Corporation, Miaoli County (TW)

(72) Inventors: Hao-Chien Cheng, Miaoli County (TW); Wei-Leun Fang, Miaoli County (TW); Kai-Chih Liang, Miaoli County (TW); Ming-Ching Wu, Miaoli County (TW)

(73) Assignee: Coretronic MEMS Corporation, Miaoli County (TW)

( * ) Notice: Subject to any disclaimer, the term of this patent is extended or adjusted under 35 U.S.C. 154(b) by 271 days.

(21) Appl. No.: 17/963,198

(22) Filed: Oct. 11, 2022

(65) Prior Publication Data

US 2024/0023447 A1 Jan. 18, 2024

(30) Foreign Application Priority Data

Jul. 18, 2022 (CN) .......................... 202210839922.6

(51) Int. Cl.
*H10N 30/20* (2023.01)

(52) U.S. Cl.
CPC ..... *H10N 30/2047* (2023.02); *H10N 30/2045* (2023.02)

(58) Field of Classification Search
CPC ........... H10N 30/2047; H10N 30/2045; H10N 30/101; G02B 26/0858
See application file for complete search history.

(56) References Cited

U.S. PATENT DOCUMENTS 7,605,966 B2 * 10/2009 Tani .................... G02B 26/0858
359/224.1
9,097,897 B2 * 8/2015 Aimono ................. G02B 26/10
(Continued)

FOREIGN PATENT DOCUMENTS

CN 211378154 U * 8/2020 ............... B81B 7/02
CN 111796417 A * 10/2020 ............. G01S 17/10
(Continued)

OTHER PUBLICATIONS

"Office Action of Taiwan Counterpart Application", issued on May 10, 2023, p. 1-p. 9.

*Primary Examiner* — Octavia Hollington
(74) *Attorney, Agent, or Firm* — JCIPRNET

(57) ABSTRACT

A piezoelectric actuating apparatus including a frame, a rotatable element, an actuating structure, and a sensing structure is provided. The rotatable element is disposed in an accommodating opening and connected to the frame through a rotating shaft structure. The rotatable element is configured to reciprocatingly swing relative to the frame with an axis of the rotating shaft structure. The actuating structure is elastically coupled to the rotatable element through at least one first elastic component. The sensing structure is elastically coupled to the rotatable element through at least one second elastic component. The actuating structure is deformed by receiving a driving signal, and drives the rotatable element to rotate around the axis through the at least one first elastic component. The rotating rotatable element is linked to the sensing structure through the at least one second elastic component to be correspondingly deformed, and outputs a sensing signal.

16 Claims, 11 Drawing Sheets

(56) References Cited

U.S. PATENT DOCUMENTS

| | | | |
|---|---|---|---|
| 10,281,718 B2* | 5/2019 | Torkkeli | G02B 26/0858 |
| 11,614,634 B2* | 3/2023 | Giusti | G03B 5/06 |
| | | | 359/557 |
| 2009/0185253 A1 | 7/2009 | Tani et al. | |
| 2011/0265565 A1* | 11/2011 | Acar | H10N 30/03 |
| | | | 205/183 |
| 2016/0069754 A1 | 3/2016 | Gu-Stoppel et al. | |
| 2020/0192199 A1* | 6/2020 | Boni | B81B 3/0021 |
| 2021/0229984 A1 | 7/2021 | Duqi et al. | |
| 2021/0376772 A1 | 12/2021 | Mutikainen et al. | |
| 2022/0066199 A1* | 3/2022 | Tung | G02B 26/0858 |
| 2023/0056353 A1* | 2/2023 | Liu | B81B 7/02 |

FOREIGN PATENT DOCUMENTS

| | | | | |
|---|---|---|---|---|
| CN | 212334582 | | 1/2021 | |
| CN | 112912784 A | * | 6/2021 | G02B 26/0858 |
| TW | 201211504 | | 3/2012 | |

* cited by examiner

PIEZOELECTRIC ACTUATING APPARATUS

CROSS-REFERENCE TO RELATED APPLICATION

This application claims the priority benefit of China application serial no. 202210839922.6, filed on Jul. 18, 2022. The entirety of the above-mentioned patent application is hereby incorporated by reference herein and made a part of this specification.

BACKGROUND

Technical Field

The disclosure relates to a piezoelectric actuating apparatus, and more particularly, to a piezoelectric actuating apparatus with sensing capabilities.

Description of Related Art

With the development of applications such as optical projection, optical communication, and optical ranging radar, the reflective micro-mirror components have become one of the priorities of development in the related art. Compared to the micro-mirror components manufactured by the precision processing technology, another type of micro-mirror components manufactured by the micro electro-mechanical system (MEMS) combined with semiconductor process integrated manufacturing technology has gradually become the mainstream due to its characteristics of mass production, miniaturization, and integration with electronic circuits. According to different driving methods, the micro-mirror components may be substantially divided into three types, namely electrostatic driving, electromagnetic driving and piezoelectric driving.

Due to easy availability of manufacturing materials as well as the relatively mature semiconductor process technology and external assembly technology, most of the micro-mirror components manufactured by the semiconductor process technology on the market are mainly electrostatically driven or electromagnetically driven. However, due to the consideration of electrostatic force, the distance between multiple groups of comb-shaped electrode structures used for electrostatic driving may not be too far from each other, resulting in the risk of electrode short circuit and increased process difficulty. Electromagnetic driving requires electroplating of coils on surfaces of micro mirrors and external assembly of magnets. In addition to increasing the difficulty of miniaturization of the components, the process of ferromagnetic materials is also less easy to integrate with the current semiconductor process.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The disclosure provides a piezoelectric actuating apparatus, which has better capability and precision in sensing deformation of a movable element.

Other objectives and advantages of the disclosure may be further understood from the technical features disclosed herein.

In order to achieve one, a part, or all of the above objectives or other objectives, an embodiment of the disclosure provides a piezoelectric actuating apparatus. The piezoelectric actuating apparatus includes a frame, a rotatable element, an actuating structure, and a sensing structure. The frame has an accommodating opening and a first side and a second side that define the accommodating opening and are opposite to each other. The rotatable element is disposed in the accommodating opening and connected to the frame through a rotating shaft structure. The rotating shaft structure has an axis, and the rotatable element is configured to reciprocatingly swing relative to the frame around the axis as a center. The actuating structure extends from the first side of the frame and is located between the rotatable element and the first side of the frame. The actuating structure is elastically coupled to the rotatable element through at least one first elastic component. The actuating structure has an actuating body, a first piezoelectric material layer, and a driving electrode disposed on a side of the first piezoelectric material layer. The first piezoelectric material layer is disposed on the actuating body. The sensing structure extends from the second side of the frame and is located between the rotatable element and the second side. The sensing structure is elastically coupled to the rotatable element through at least one second elastic component. The sensing structure has a sensing body, a second piezoelectric material layer, and a sensing electrode disposed on a side of the second piezoelectric material layer. The second piezoelectric material layer is disposed on the sensing body. The at least one first elastic component and the at least one second elastic component are respectively disposed on two opposite sides of the axis. The actuating structure is deformed by receiving a driving signal through the driving electrode, and drives the rotatable element to rotate around the axis as a central axis through the at least one first elastic component. The rotating rotatable element is linked to the sensing structure through the at least one second elastic component to be correspondingly deformed, and outputs a sensing signal through the sensing electrode.

Based on the above, in the piezoelectric actuating apparatus according to an embodiment of the disclosure, the accommodating opening of the frame is provided with the rotatable element and the actuating structure and the sensing structure disposed on the two opposite sides of the rotatable element. The actuating structure may be electrically driven to be deformed, and drives the rotatable element to rotate relative to the frame around the axis of the rotating shaft structure as the center through the first elastic components. The rotating rotatable element may drive the sensing structure through the second elastic components to be correspondingly deformed, and output the corresponding sensing signal through the sensing structure during the deformation. Accordingly, in addition to achieving the high degree of integration of the actuating structure, the rotatable element, and the sensing structure to achieve the miniaturization of the piezoelectric actuating apparatus, the sensing signal obtained at the same time when the rotatable element is actuated may more truly present the actual degree of swing of the rotatable element, which is helpful to improve the sensing capability of the piezoelectric actuating apparatus.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
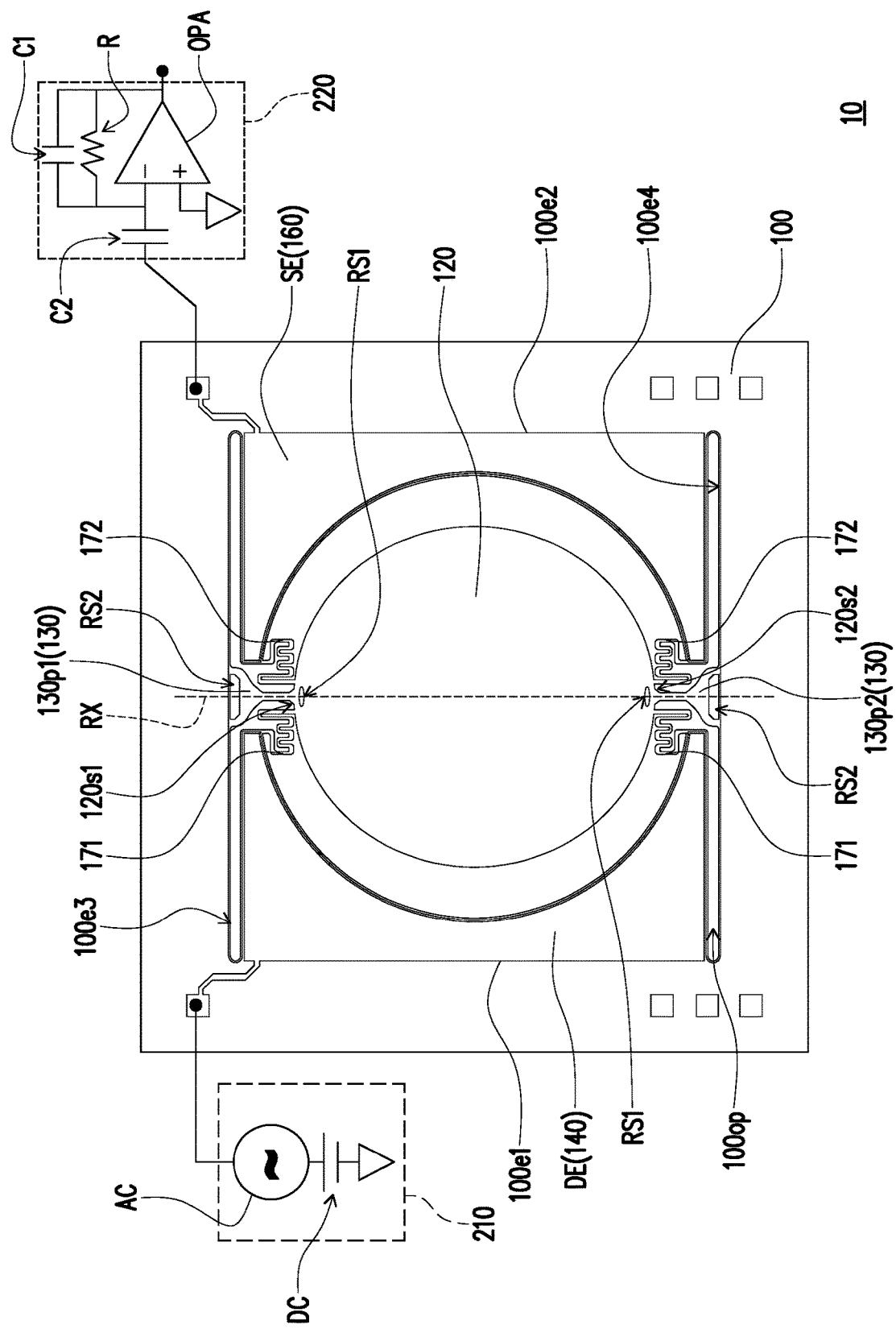
FIG. 1 is a schematic front view of a piezoelectric actuating apparatus according to the first embodiment of the disclosure.
Figure 2:
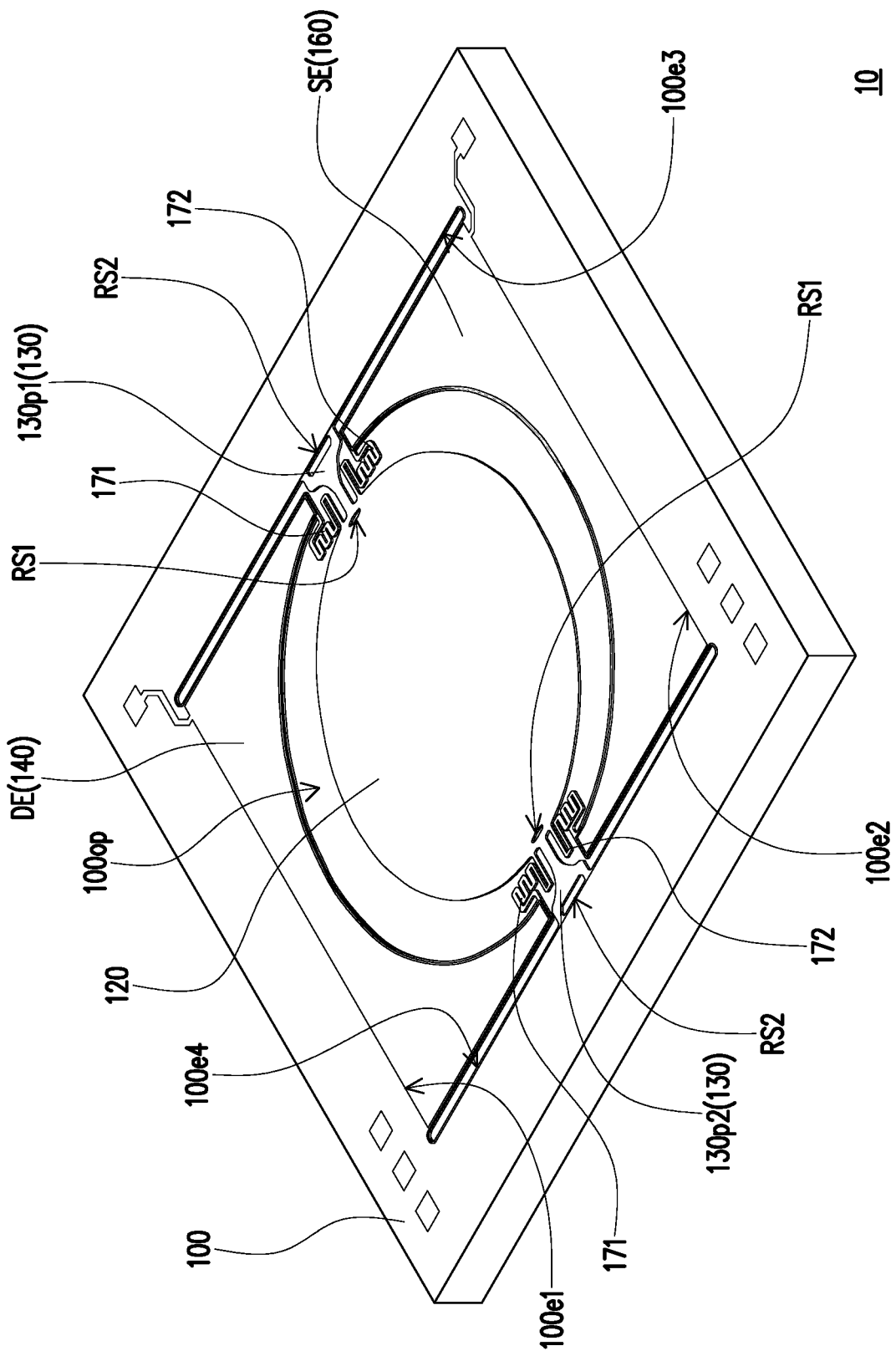
FIG. 2 is a schematic perspective view of the piezoelectric actuating apparatus of FIG. 1.
Figure 3:
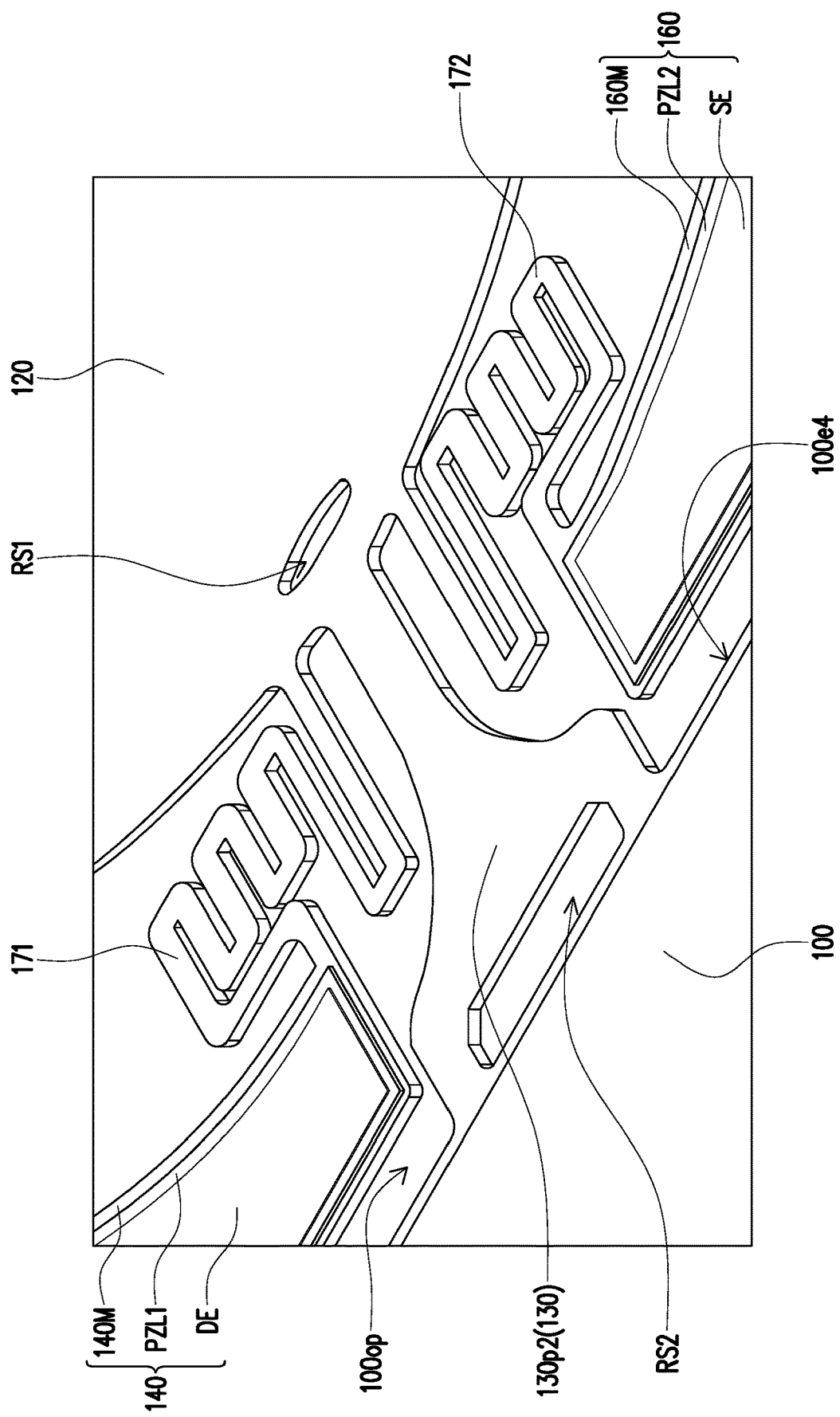
FIG. 3 is a partial enlarged view of the piezoelectric actuating apparatus of FIG. 2.
Figure 4:
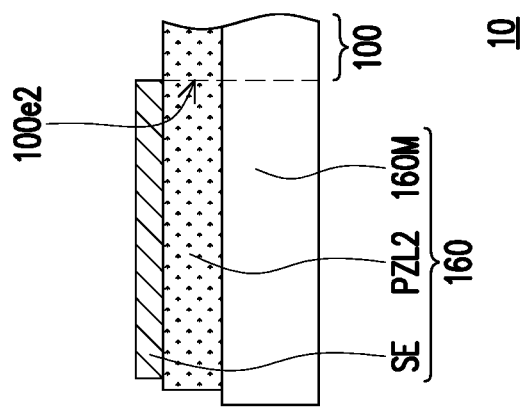
FIG. 4 is a schematic cross-sectional view of the piezoelectric actuating apparatus of FIG. 2.
Figure 4:
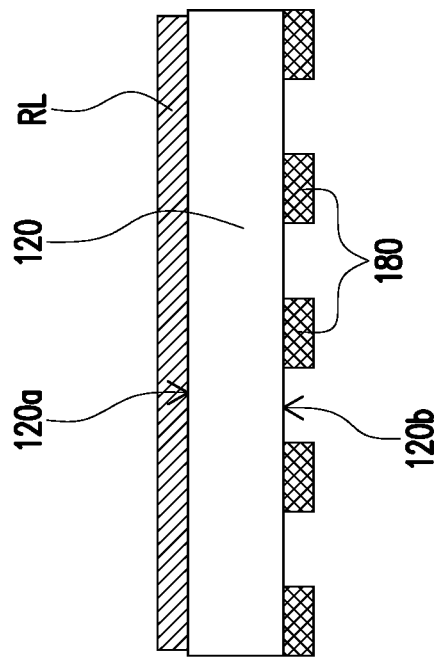
Figure 4:
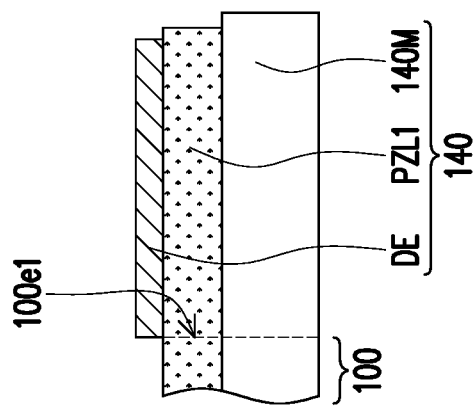
Figure 5:
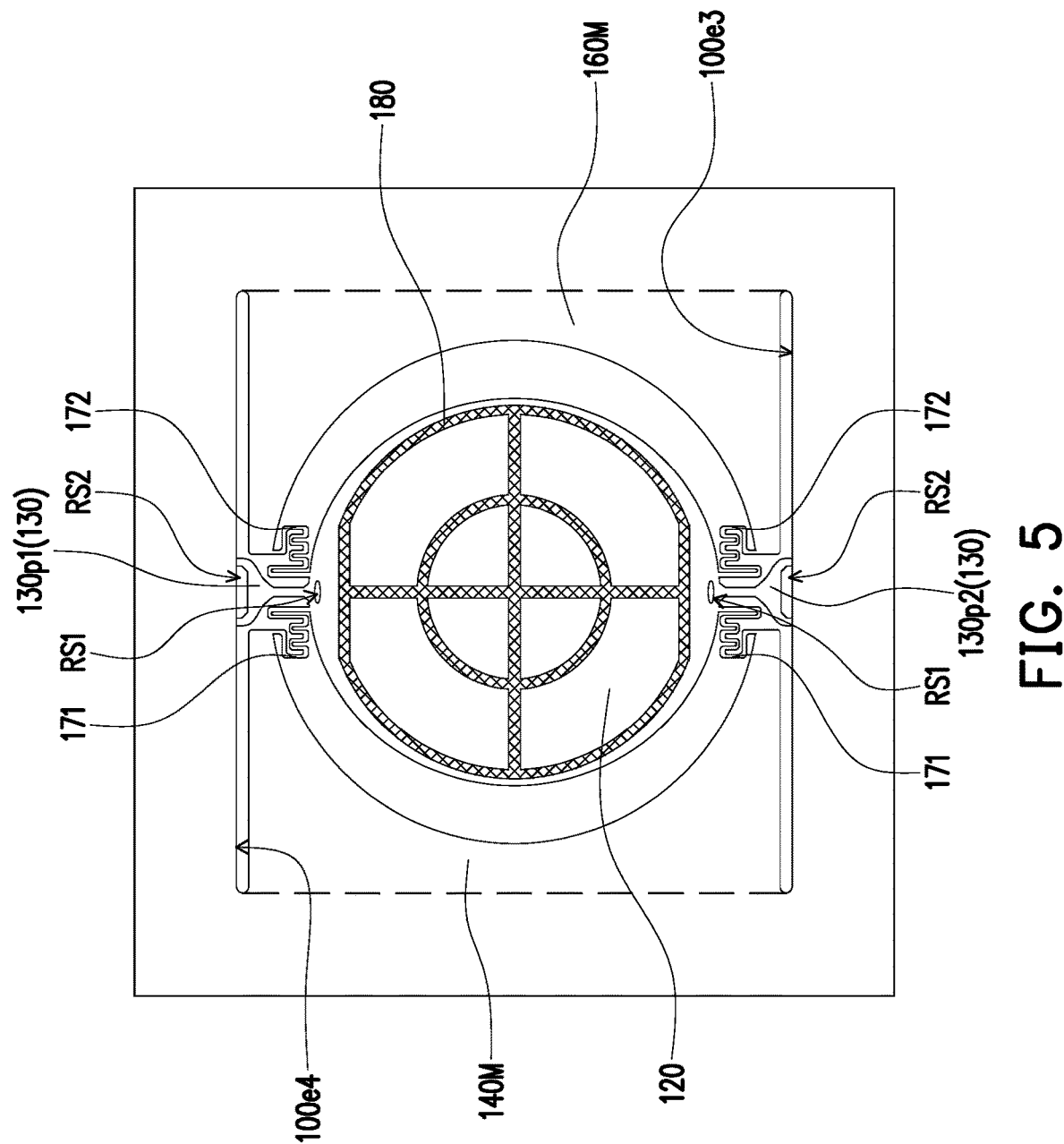
FIG. 5 is a schematic rear view of the piezoelectric actuating apparatus of FIG. 1.
Figure 6:
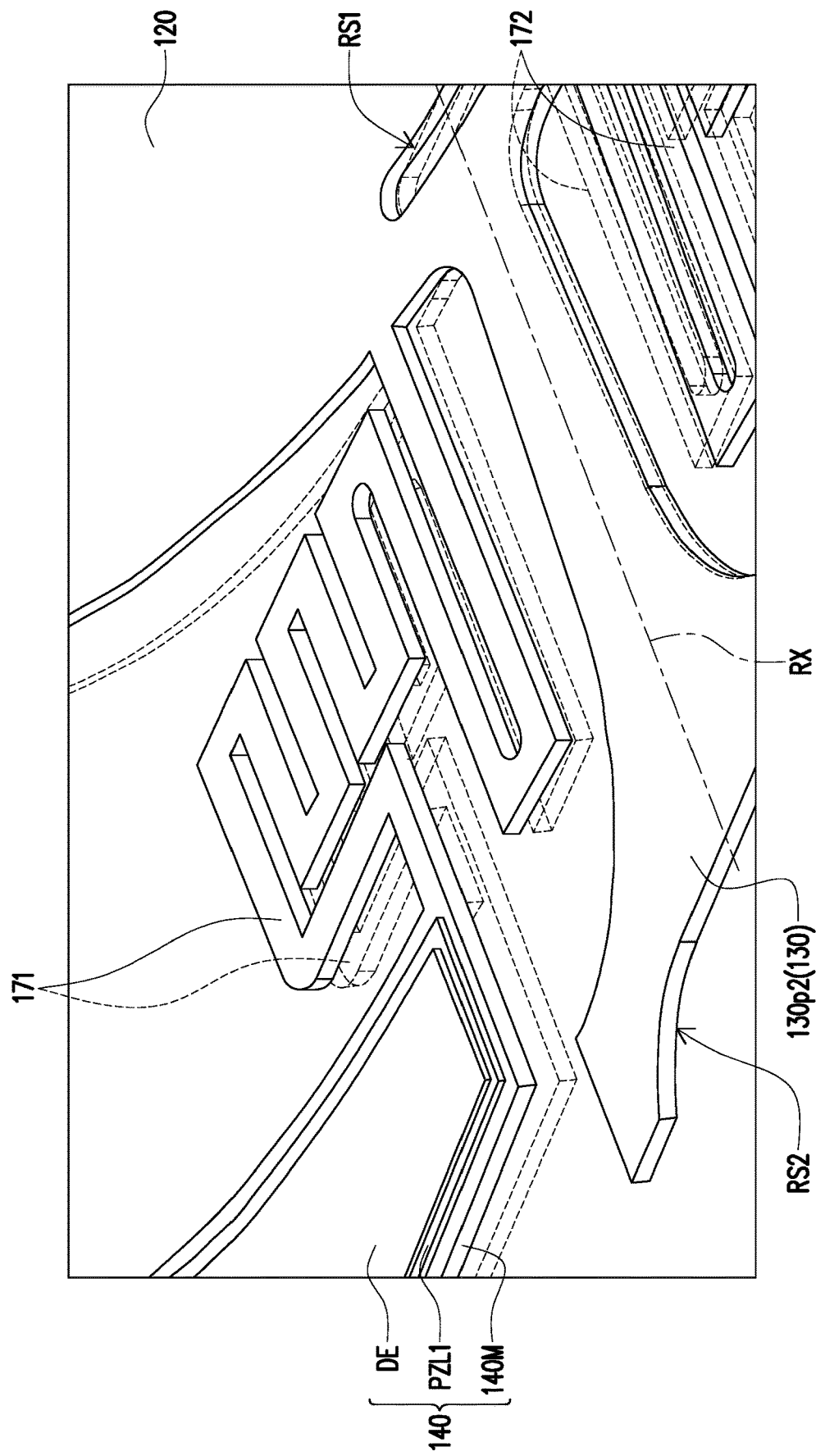
FIG. 6 is a partial enlarged view of the piezoelectric actuating apparatus of FIG. 2 when actuated.
Figure 7:
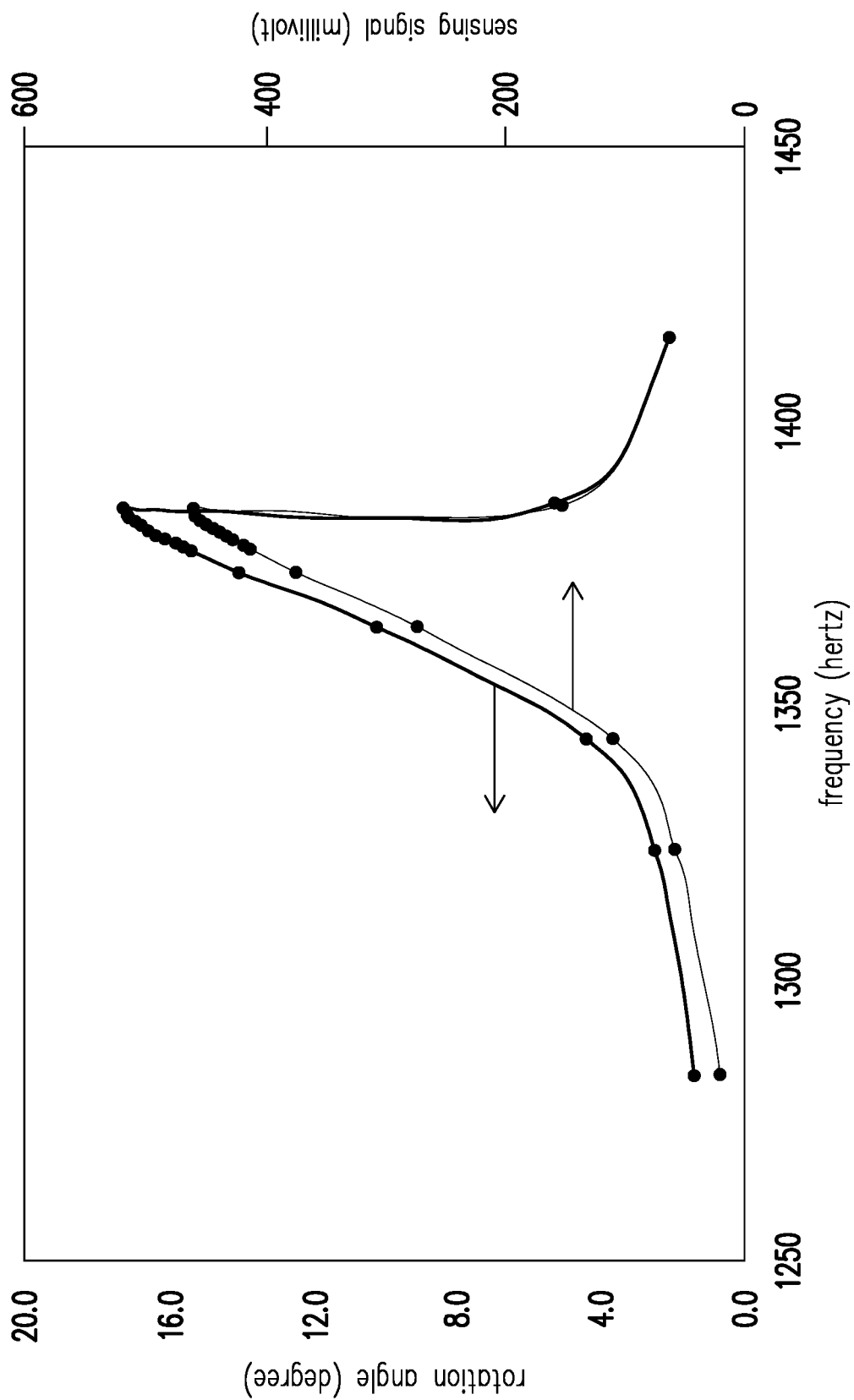
FIG. 7 is a view of a relationship between a rotation angle of a rotatable element and a sensing signal of FIG. 1 and different operating frequencies.
Figure 8:
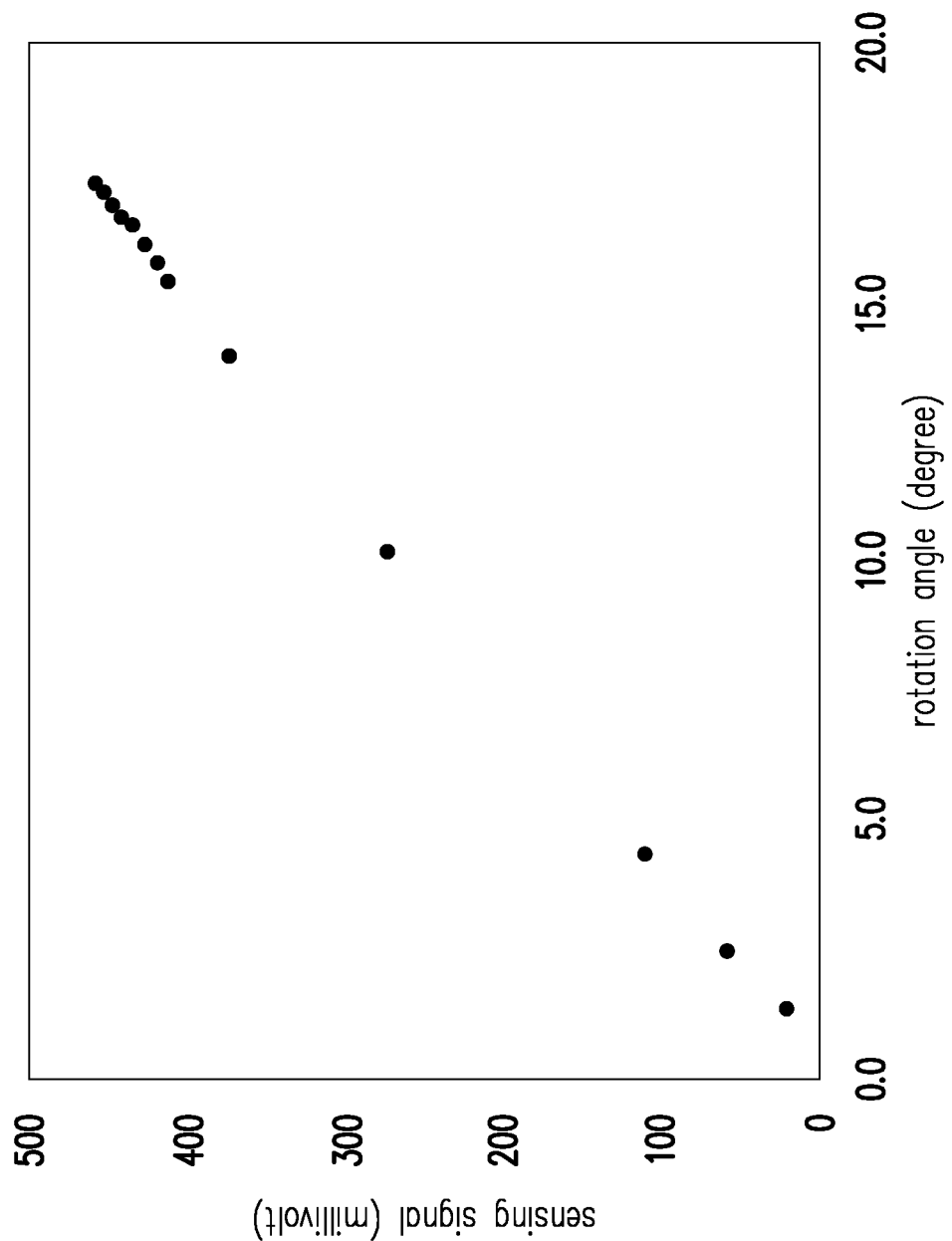
FIG. 8 is a view of a relationship between the sensing signal and the rotation angle of the rotatable element of FIG. 7.

FIG. 1 is a schematic front view of a piezoelectric actuating apparatus according to the first embodiment of the disclosure. FIG. 2 is a schematic perspective view of the piezoelectric actuating apparatus of FIG. 1. FIG. 3 is a partial enlarged view of the piezoelectric actuating apparatus of FIG. 2. FIG. 4 is a schematic cross-sectional view of the piezoelectric actuating apparatus of FIG. 2. FIG. 5 is a schematic rear view of the piezoelectric actuating apparatus of FIG. 1. FIG. 6 is a partial enlarged view of the piezoelectric actuating apparatus of FIG. 2 when actuated. FIG. 7 is a view of a relationship between a rotation angle of a rotatable element and a sensing signal of FIG. 1 and different operating frequencies. FIG. 8 is a view of a relationship between the sensing signal and the rotation angle of the rotatable element of FIG. 7. The illustration of a reflection layer RL in FIG. 4 is omitted in FIGS. 1 to 3 and 6.

Referring to FIGS. 1 to 3, a piezoelectric actuating apparatus 10 includes a frame 100 and a rotatable element 120. The frame 100 has an accommodating opening 100op and a first side 100e1 and a second side 100e2. The first side 100e1 and the second side 100e2 define the accommodating opening 100op and are opposite to each other. The rotatable element 120 is disposed in the accommodating opening 100op, and is connected to the frame 100 through a rotating shaft structure 130. The rotating shaft structure 130 has an axis RX, and the rotatable element 120 is disposed on the axis RX. The rotatable element 120 is configured to reciprocatingly swing relative to the frame 100 with the axis RX as a center.

In this embodiment, the rotatable element 120 is, for example, a micro planar reflector, and an outline of the rotatable element 120 is substantially in a shape of a circular sheet. However, the disclosure is not limited thereto. In other embodiments that are not shown, the outline of the rotatable element may also be a rectangle or other suitable polygons. In this embodiment, the rotatable element 120 has a first side 120s1 and a second side 120s2 that are arranged along an axial direction of the axis RX and are opposite to each other. The frame 100 further has a third side 100e3 and a fourth side 100e4 that define the accommodating opening 100op and are opposite to each other. That is, the first side 100e1, the second side 100e2, the third side 100e3, and the fourth side 100e4 are four inner walls of the accommodating opening 100op of the frame 100, and the third side 100e3 and the fourth side 100e4 respectively connect to (e.g., perpendicular to) the first side 100e1 and the second side 100e2. That is, an outline of the accommodating opening 100op defined by the four sides of the frame 100 in this embodiment may be a rectangle, but the disclosure is not limited thereto.

In this embodiment, the rotating shaft structure 130 may include a first portion 130p1 and a second portion 130p2. The first portion 130p1 of the rotating shaft structure 130 is connected to the first side 120s1 of the rotatable element 120 and the third side 100e3 of the frame 100. The second portion 130p2 is connected to the second side 120s2 of the rotatable element 120 and the fourth side 100e4 of the frame 100. Specifically, the axial direction of the axis RX of the rotating shaft structure 130 may be defined by an arrangement direction of the first portion 130p1 and the second portion 130p2 of the rotating shaft structure 130 connected between the frame 100 and the rotatable element 120. For example, in this embodiment, the axial direction of the axis RX may be perpendicular to the third side 100e3 and the fourth side 100e4 of the frame 100.

In order to drive the rotatable element 120 to rotate around the axis RX, the piezoelectric actuating apparatus 10 further includes an actuating structure 140 disposed between the rotatable element 120 and the first side 100e1 of the frame 100. More specifically, the actuating structure 140 extends from the first side 100e1 of the frame 100 into the accommodating opening 100op of the frame 100, and has a gap from the rotatable element 120. In this embodiment, an outline of a side (i.e., a side away from the first side 100e1 of the frame 100) of the actuating structure 140 facing the rotatable element 120 is conformal to the outline of the rotatable element 120. Therefore, the side of the actuating structure 140 facing towards the rotatable element 120 may have a half-moon or semi-circular outline, but the disclosure is not limited thereto.

The actuating structure 140 may be elastically coupled to the rotatable element 120 through two first elastic components 171. For example, in this embodiment, one of the two first elastic components 171 is disposed on the first side 120s1 of the rotatable element 120 and close to the first portion 130p1 of the rotating shaft structure 130, and the other of the two first elastic components 171 is disposed on the second side 120s2 of the rotatable element 120 and close to the second portion 130p2 of the rotating shaft structure 130. The gap is defined by the two first elastic components 171, the actuating structure 140, and the rotatable element 120. In addition, the two first elastic components 171 are connected between the rotatable element 120 and the actuating structure 140. In detail, the actuating structure 140 includes an actuating body 140M, a first piezoelectric material layer PZL1, and a driving electrode DE. The first piezoelectric material layer PZL1 is disposed on the actuating body 140M. The driving electrode DE is disposed on a side of the first piezoelectric material layer PZL1 facing away from the actuating body 140M. More specifically, the first piezoelectric material layer PZL1 is sandwiched between the actuating body 140M and the driving electrode DE (as shown in FIG. 3). The actuating body 140M of the actuating structure 140 further has a first ground electrode (not shown) coupled to the first piezoelectric material layer PZL1. One side of the actuating body 140M is connected to the first side 100e1 of the frame 100. Two opposite end portions of each of the first elastic components 171 are respectively connected to the rotatable element 120 and the other side of the actuating body 140M, and a portion between the two opposite end portions of each first elastic component 171 is folded into multiple U-shaped bends.

The piezoelectric actuating apparatus 10 may further include a driving circuit 210 (schematically shown in FIG. 1). The driving circuit 210 is coupled to the driving electrode DE of the actuating structure 140 to provide a driving signal. For example, the driving circuit 210 may be provided with an alternating current power source AC and a direct current power source DC. One end of the alternating current power source AC is coupled to the driving electrode DE, and the other end of the alternating current power source AC is coupled to one end of the direct current power source DC. The other end of the direct current power source DC is grounded. That is, the driving signal from the driving circuit 210 may be an AC voltage signal with a DC offset, but the disclosure is not limited thereto.

When the actuating structure 140 is grounded, and the driving electrode DE is enabled by the driving circuit 210 to be applied with a positive voltage, the first piezoelectric material layer PZL1 generates compressive strain to drive the actuating body 140M to generate a contraction deformation. Referring to FIGS. 1 and 6, at this time, the actuating structure 140 takes the side connected to the first side 100e1 of the frame as a supporting side, and the other side of the actuating body 140M is deflected toward a direction in which the driving electrode DE is provided (e.g., deflected upward relative to the frame 100). The actuating structure 140 drives the rotatable element 120 to rotate along a direction with the axis RX of the rotating shaft structure 130 as a central axis through the two first elastic components 171.

Although not shown in the drawing, it is not difficult to understand that when the actuating structure 140 is grounded, and the driving electrode DE is enabled by the driving circuit 210 to be applied with a negative voltage, the first piezoelectric material layer PZL1 generates tensile strain to drive the actuating body 140M to generate a tensile deformation, so that the actuating structure 140 takes the side connected to the first side 100e1 of the frame 100 as the supporting side, while the other side of the actuating body 140M is deflected toward a direction in which the actuating body 140M is provided (e.g., deflected downward relative to the frame 100), and that the actuating structure 140 drives the rotatable element 120 to rotate along an opposite direction to a rotation direction of the rotatable element 120 in FIG. 6 through the two first elastic components 171. When the driving electrode DE is enabled by the driving circuit 210, so that the driving electrode DE is applied with the positive voltage and the negative voltage alternately, the rotatable element 120 reciprocates and rotates around the axis RX as the central axis by a predetermined angle.

In order to sense an actual degree of rotation of the rotatable element 120 synchronously and more truly, the piezoelectric actuating apparatus 10 further includes a sensing structure 160 disposed between the rotatable element 120 and the second side 100e2 of the frame 100. More specifically, the sensing structure 160 extends from the second side 100e2 of the frame 100 into the accommodating opening 100op of the frame 100, and has a gap from the rotatable element 120. In this embodiment, an outline of a side (i.e., a side away from the second side 100e2 of the frame 100) of the sensing structure 160 facing towards the rotatable element 120 is conformal to the outline of the rotatable element 120. Therefore, the side of the sensing structure 160 facing the rotatable element 120 may have a half-moon or semi-circular outline, but the disclosure is not limited thereto.

The sensing structure 160 may be elastically coupled to the rotatable element 120 through two second elastic components 172. For example, in this embodiment, one of the two second elastic components 172 is disposed on the first side 120s1 of the rotatable element 120 and close to the first portion 130p1 of the rotating shaft structure 130, and the other of the two second elastic components 172 is disposed on the second side 120s2 of the rotatable element 120 and close to the second portion 130p2 of the rotating shaft structure 130. In addition, the two second elastic components 172 are connected between the rotatable element 120 and the sensing structure 160. The gap is defined by the two second elastic components 172, the sensing structure 160, and rotatable element 120. In detail, the sensing structure 160 includes a sensing body 160M, a second piezoelectric material layer PZL2, and a sensing electrode SE. The second piezoelectric material layer PZL2 is disposed on the sensing body 160M. The sensing electrode SE is disposed on a side of the second piezoelectric material layer PZL2 away from the sensing body 160M. More specifically, the second piezoelectric material layer PZL2 is sandwiched between the sensing body 160M and the sensing electrode SE (as shown in FIG. 3). The sensing body 160M of the sensing structure 160 further has a second ground electrode (not shown) coupled to the second piezoelectric material layer PZL2. One side of the sensing body 160M is connected to the second side 100e2 of the frame 100. Two opposite end portions of each second elastic component 172 are respectively connected to the rotatable element 120 and the other side of the sensing body 160M, and a portion between the two opposite end portions of each of the second elastic components 172 is folded into multiple U-shaped bends. In this embodiment, the actuating structure 140 and the sensing structure 160 are symmetrically disposed on two opposite sides of the rotatable element 120.

The piezoelectric actuating apparatus 10 may further include a sensing circuit 220 (schematically shown in FIG. 1). The sensing circuit 220 is coupled to the sensing electrode SE of the sensing structure 160 to receive a sensing signal. For example, the sensing circuit 220 may include an amplifier circuit, and the amplifier circuit may include an operational amplifier OPA, a capacitor C1, a capacitor C2, and a resistor R. The capacitor C1 and the resistor R are connected in parallel with each other and connected between an inverting input end of the operational amplifier OPA and an output end of the operational amplifier OPA, and a non-inverting input end of the operational amplifier OPA is grounded. The capacitor C2 is connected to the inverting input end of the operational amplifier OPA and the sensing electrode SE of the sensing structure 160. More specifically, the amplifier circuit in this embodiment is, for example, a charge amplifier configured to convert an AC current signal into the AC voltage signal, but the disclosure is not limited thereto.

When the rotatable element 120 is driven by the actuating structure 140 to rotate with the axis RX of the rotating shaft structure 130 as the central axis, the rotatable element 120 may be linked to the sensing body 160M of the sensing structure 160 through the two second elastic components 172 to be correspondingly deformed, and output the sensing signal to the sensing circuit 220 through the sensing electrode SE. For example, as shown in FIGS. 1, 3, and 6, when the driving electrode DE located on one side of the axis RX is applied with the positive voltage, the upwardly deflected actuating structure 140 drives the rotatable element 120 to rotate clockwise around the axis RX through the first elastic components 171. At this time, the rotating rotatable element 120 drives the second elastic components 172, so that the sensing structure 160 located on the other side of the axis RX exerts the tensile strain to deflect downward (not shown). In addition, the applied tensile strain generates negative charges on a surface of the second piezoelectric material layer PZL2 connected to the sensing electrode SE, thereby generating the corresponding sensing signal to the sensing circuit 220.

That is to say, when the driving electrode DE of the actuating structure 140 is applied with the positive voltage to drive the rotatable element 120 to rotate, the sensing electrode SE correspondingly generates the negative voltage because the sensing structure 160 is deformed in an opposite direction to the actuating structure 140.

Since a configuration of the actuating structure 140 and the first elastic components 171 and a configuration of the sensing structure 160 and the second elastic components 172 are symmetrically disposed with the axis RX of the rotating shaft structure 130 as the center, deformational stress of the actuating structure 140 may be more directly reflected on deformational stress of the sensing structure 160 through rotation of the rotatable element 120. To further illustrate, the sensing circuit 220 and the driving circuit 210 may be coupled to a control unit (not shown), and the control unit may adjust the driving signal of the driving circuit 210 correspondingly according to the sensing signal from the sensing circuit 220. When the actuating structure 140 drives the rotatable element 120 to rotate, the sensing structure 160 outputs the corresponding sensing signal to the sensing circuit 220 at the same time, so that a feedback mechanism may synchronize the entire piezoelectric actuating apparatus 10 accordingly to make reciprocating swing of the rotatable element 120 more accurate, thereby improving stability of the piezoelectric actuating apparatus 10. As shown in FIGS. 7 and 8, intensity of the sensing signal generated by the sensing structure 160 in this embodiment for rotation angles at different driving frequencies are substantially proportional to the rotation angles of the rotatable element 120 at different driving frequencies. Therefore, in addition to allowing the sensing signal to more truly present the degree of rotation of the rotatable element 120, a sensing capability of the piezoelectric actuating apparatus 10 may also be effectively improved. In addition, the above symmetrical configuration may further achieve a high degree of integration of the rotatable element 120, the actuating structure 140, and the sensing structure 160, which is helpful for achieving miniaturization of the piezoelectric actuating apparatus 10.

Continuing to refer to FIGS. 1 to 3, further, in order to release twisting stress generated at a connection between the rotatable element 120 and the rotating shaft structure 130 during reciprocating swing (twist), the rotatable element 120 is provided with two slots RS1 respectively in two regions adjacent to the first portion 130p1 and the second portion 130p2 of the rotating shaft structure 130, and the two slots RS1 are located on the axis RX of the rotating shaft structure 130. Each of the slots RS1 is, for example, a through hole disposed on the rotatable element 120 or a groove recessed relative to a surface of the rotatable element 120.

On the other hand, a slot RS2 is provided at a connection between the first portion 130p1 of the rotating shaft structure 130 and the frame 100 (e.g., the third side 100e3), and another slot RS2 is provided at another connection between the second portion 130p2 of the rotating shaft structure 130 and the frame 100 (e.g., the fourth side 100e4). In addition, the two slots RS2 are located on the axis RX of the rotating shaft structure 130. Accordingly, the twisting stress generated at each of the connections between the rotating shaft structure 130 and the frame 100 due to the reciprocating swing of the rotatable element 120 may be released. Each of the slots RS2 is, for example, a through hole disposed on the first portion 130p1/the second portion 130p2.

It is particularly mentioned that the first portion 130p1 and the second portion 130p2 of the rotating shaft structure 130 have a Y-shaped outline due to the respective slots RS2. Two ends of the first portion 130p1 and the second portion 130p2, which define the slot RS2, are respectively connected to the frame 100, so as to enhance stability and anti-vibration capability of the rotatable element 120 during the reciprocating swing.

Referring to FIGS. 4 and 5, in this embodiment, the actuating body 140M, the sensing body 160M, the rotating shaft structure 130, the first elastic components 171, the second elastic components 172, and the rotatable element 120 may be selectively integrally formed. The rotatable element 120 has a first surface 120a and a second surface 120b facing away from each other. The first surface 120a may be provided with the reflection layer RL, so that a light beam (not shown) incident to the first surface 120a of the rotatable element 120 may have better reflection efficiency through the reflection layer RL. On the other hand, in order to improve rigidity (or stiffness) of the rotatable element 120, a reinforced structure 180 may be disposed on the second surface 120b of the rotatable element 120. In this embodiment, the reinforced structure 180 is, for example, an annular structure surrounding an edge of the rotatable element 120, or inner and outer annular structures surrounding the edge and a central region of the rotatable element 120, and at least one connecting rib (as shown in FIG. 5) is configured to connect between the two annular structures, but the disclosure is not limited thereto.

It should be noted that in other embodiments that are not shown, the number of the first elastic components 171 connected to the rotatable element 120 and the actuating structure 140 and the second elastic components 172 connected to the rotatable element 120 and the sensing structure 160 may be adjusted according to different application designs, for example, one or more than three respectively, as long as the symmetrical configuration of the first elastic components 171 and the second elastic components 172 may be maintained.

Some other embodiments are provided below to describe the invention in detail, where the same reference numerals denote the same or like components, and descriptions of the same technical contents are omitted. The aforementioned embodiment may be referred for descriptions of the omitted parts, and detailed descriptions thereof are not repeated in the following embodiment.

Figure 9:
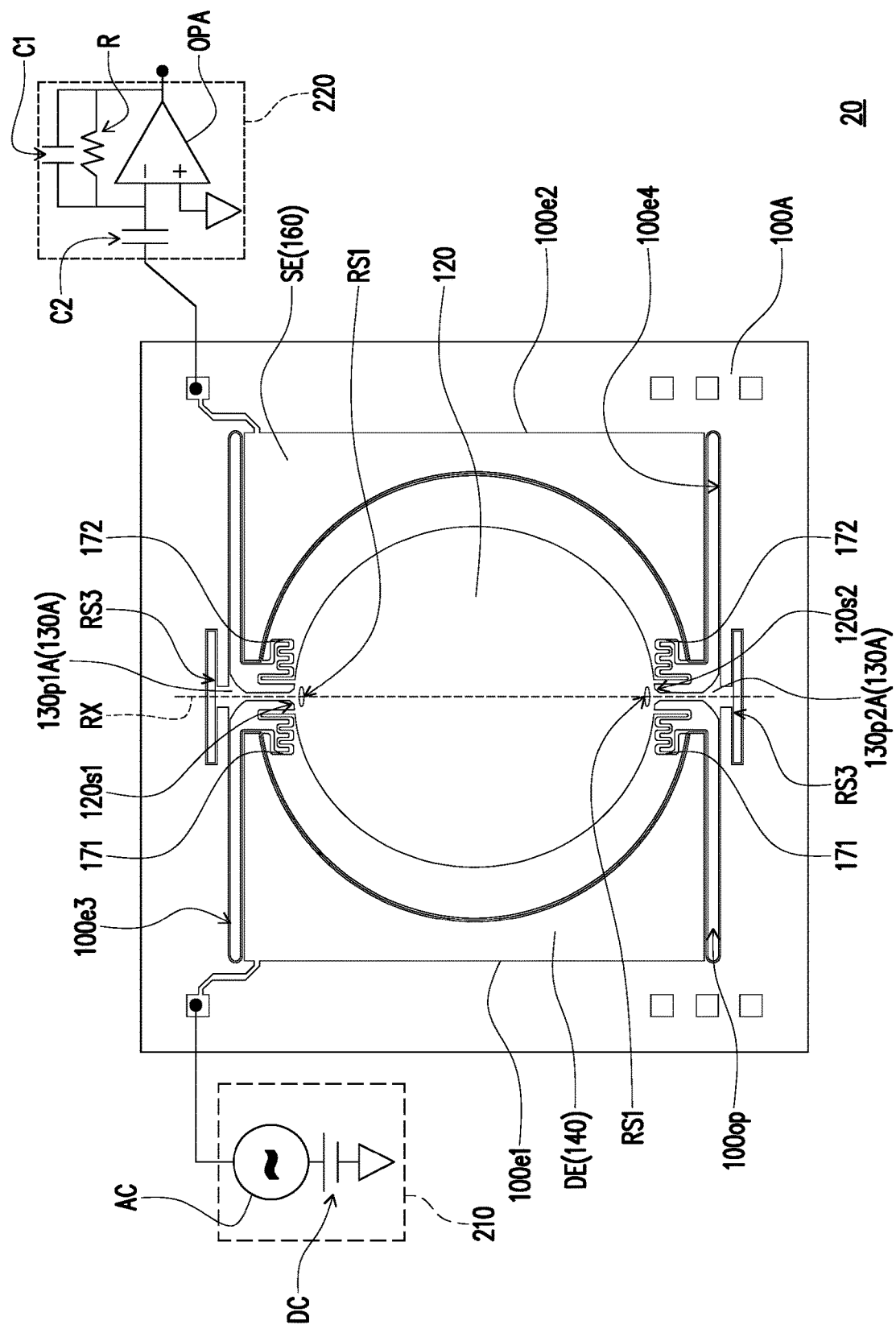
FIG. 9 is a schematic front view of a piezoelectric actuating apparatus according to the second embodiment of the disclosure.
Figure 10:
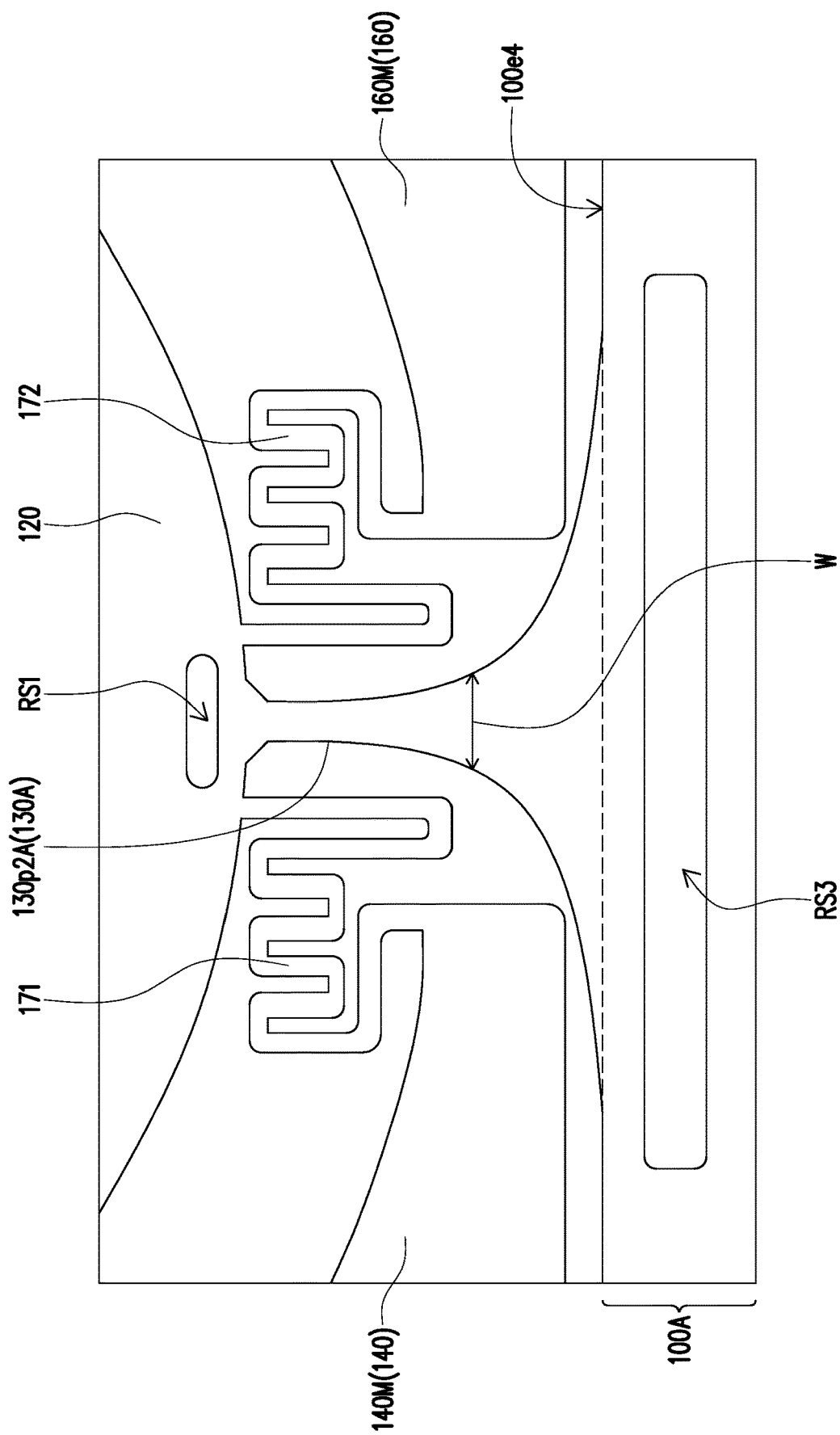
FIG. 10 is a partial enlarged rear view of the piezoelectric actuating apparatus of FIG. 9.

FIG. 9 is a schematic front view of a piezoelectric actuating apparatus according to the second embodiment of the disclosure. FIG. 10 is a partial enlarged rear view of the piezoelectric actuating apparatus of FIG. 9. Referring to FIGS. 9 and 10, a difference between a piezoelectric actuating apparatus 20 of this embodiment and the piezoelectric actuating apparatus 10 of FIG. 1 is that a configuration of the rotating shaft structure is different. Specifically, in this embodiment, a first portion 130p1A and a second portion 130p2A of a rotating shaft structure 130A each have a T-shaped outline.

More specifically, a width of the first portion 130p1A of the rotating shaft structure 130A in an extending direction along the third side 100e3 of a frame 100A is gradually increased from the rotatable element 120 toward the third side 100e3 of the frame 100A, and a width W (as shown in FIG. 10) of the second portion 130p2A in an extending direction along the fourth side 100e4 of the frame 100A is gradually increased from the rotatable element 120 toward the fourth side 100e4 of the frame 100A. Accordingly, the stability and anti-vibration capability of the rotatable element 120 during rotation may be further enhanced.

In this embodiment, in order to release the twisting stress generated at a connection between the rotating shaft structure 130A and the frame 100A due to the reciprocating swing of the rotatable element 120, the frame 100A is provided with two slots RS3 respectively in two regions adjacent to the first portion 130p1A and the second portion 130p2A of the rotating shaft structure 130A, and the two slots RS3 are located on the axis RX of the rotating shaft structure 130A. Each of the slots RS3 is, for example, a through hole disposed on the frame 100A.

Figure 11:
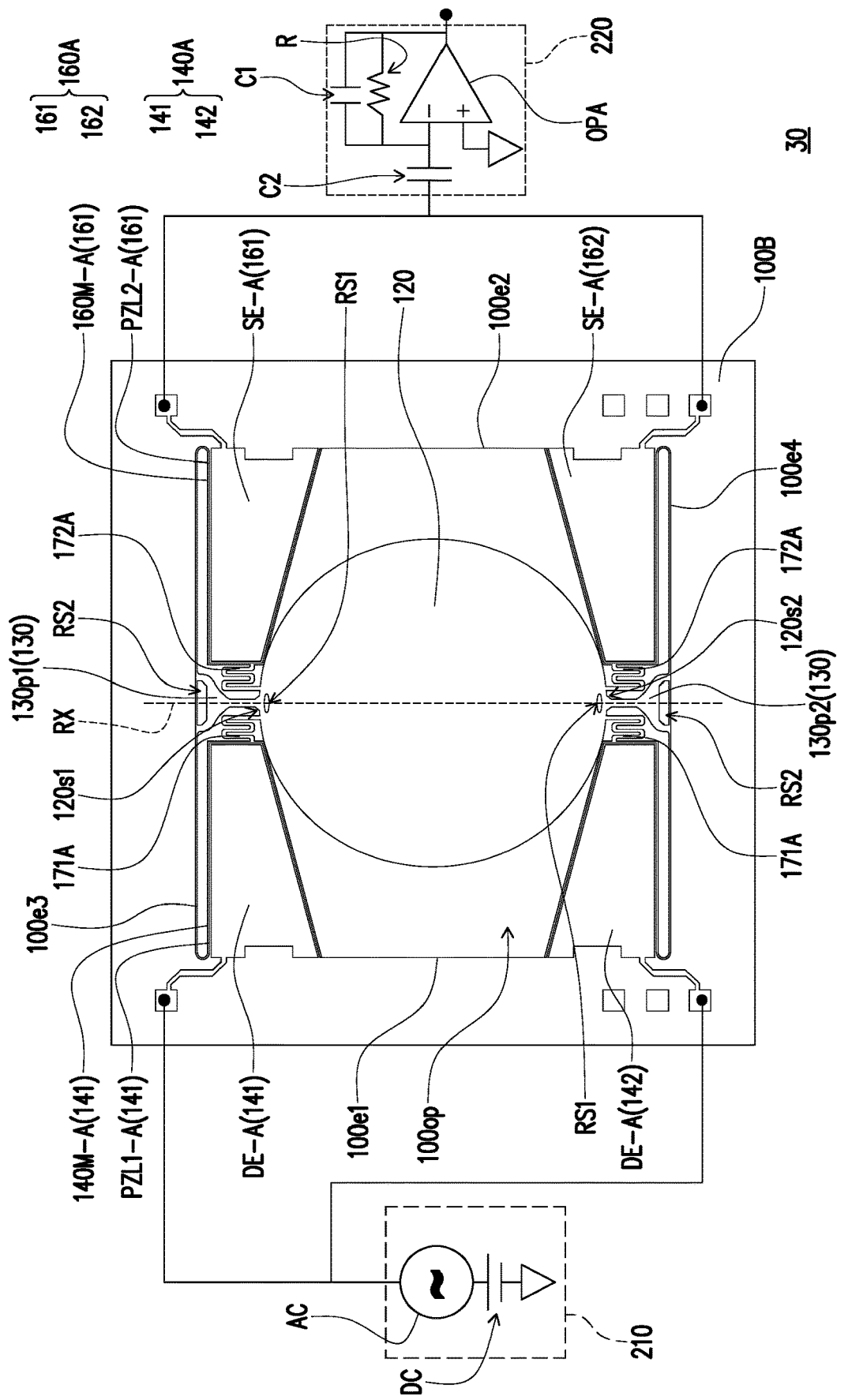
FIG. 11 is a schematic front view of a piezoelectric actuating apparatus according to the third embodiment of the disclosure.

FIG. 11 is a schematic front view of a piezoelectric actuating apparatus according to the third embodiment of the disclosure. Referring to FIG. 11, a main difference between a piezoelectric actuating apparatus 30 of this embodiment and the piezoelectric actuating apparatus 10 of FIG. 1 is that configurations of the actuating structure and the sensing structure are different. Specifically, in this embodiment, an actuating structure 140A includes a first actuating arm 141 and a second actuating arm 142 that are respectively disposed on the first side 120s1 and the second side 120s2 of the rotatable element 120 and structurally separated from each other. Two opposite sides of the first actuating arm 141 are respectively connected to the first side 100e1 of a frame 100B and a first elastic component 171A. Two opposite sides of the second actuating arm 142 are respectively connected to the first side 100e1 of the frame 100B and another first elastic component 171A. The two first elastic components 171A are elastically coupled to the first side 120s1 and the second side 120s2 of the rotatable element 120, respectively.

Likewise, a sensing structure 160A includes a first sensing arm 161 and a second sensing arm 162 that are disposed on the first side 120s1 and the second side 120s2 of the rotatable element 120 and structurally separated from each other. Two opposite sides of the first sensing arm 161 are respectively connected to the second side 100e2 of the frame 100B and a second elastic component 172A. Two opposite sides of the second sensing arm 162 are respectively connected to the second side 100e2 of the frame 100B and another second elastic component 172A. The two second elastic components 172A are elastically coupled to the first side 120s1 and the second side 120s2 of the rotatable element 120, respectively.

Similar to the actuating structure 140 of FIG. 3, the first actuating arm 141 and the second actuating arm 142 of the actuating structure 140A in this embodiment each include an actuating body 140M-A, a first piezoelectric material layer PZL1-A, and a driving electrode DE-A. The first piezoelectric material layer PZL1-A is sandwiched between the actuating body 140M-A and the driving electrode DE-A. The respective driving electrodes DE-A of the first actuating arm 141 and the second actuating arm 142 are both electrically coupled to the driving circuit 210 to receive the driving signal. The first sensing arm 161 and the second sensing arm 162 of sensing structure 160A in this embodiment each include a sensing body 160M-A, a second piezoelectric material layer PZL2-A, and a sensing electrode SE-A. The second piezoelectric material layer PZL2-A is sandwiched between the sensing body 160M-A and the sensing electrode SE-A. The respective sensing electrodes SE-A of the first sensing arm 161 and the second sensing arm 162 are both electrically coupled to the sensing circuit 220 to output the sensing signal.

Since operating principles of the two actuating arms and the two sensing arms of this embodiment are similar to the actuating structure 140 and the sensing structure 160 of FIG. 1, relevant paragraphs of the foregoing embodiments may be referred for detailed description, and thus the same details will not be repeated in the following.

Based on the above, in the piezoelectric actuating apparatus according to an embodiment of the disclosure, the accommodating opening of the frame accommodates with the rotatable element and the actuating structure and the sensing structure symmetrically disposed on the two opposite sides of the rotatable element. The actuating structure may be driven to be deformed, and correspondingly drives the rotatable element to reciprocatingly swing (rotate) relative to the frame around the axis of the rotating shaft structure as the center through the first elastic components. The rotating rotatable element may drive the sensing structure through the second elastic components at the same time to be correspondingly deformed, and output the corresponding sensing signal through the sensing structure during the deformation of the sensing structure. Accordingly, in addition to achieving the high degree of integration of the actuating structure, the rotatable element, and the sensing structure to achieve the miniaturization of the piezoelectric actuating apparatus, the sensing signal obtained at the same time when the rotatable element is actuated may more truly present the actual degree of rotation of the rotatable element, which is helpful to improve the sensing capability of the piezoelectric actuating apparatus.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A piezoelectric actuating apparatus, comprising a frame, a rotatable element, an actuating structure, and a sensing structure, wherein the frame has an accommodating opening and a first side and a second side that define the accommodating opening and are opposite to each other;

the rotatable element is disposed in the accommodating opening and connected to the frame through a rotating shaft structure, the rotating shaft structure has an axis, and the rotatable element is configured to reciprocatingly swing relative to the frame around the axis as a center;

the actuating structure extends from the first side of the frame and is located between the rotatable element and the first side of the frame, the actuating structure is elastically coupled to the rotatable element through at least one first elastic component, the actuating structure has an actuating body, a first piezoelectric material layer, and a driving electrode disposed on a side of the first piezoelectric material layer, and the first piezoelectric material layer is disposed on the actuating body; and the sensing structure extends from the second side of the frame and is located between the rotatable element and the second side, the sensing structure is elastically coupled to the rotatable element through at least one second elastic component, the sensing structure has a sensing body, a second piezoelectric material layer, and a sensing electrode disposed on a side of the second piezoelectric material layer, the second piezoelectric material layer is disposed on the sensing body, and the at least one first elastic component and the at least one second elastic component are respectively disposed on two opposite sides of the axis, wherein the actuating structure is deformed by receiving a driving signal through the driving electrode, and drives the rotatable element to rotate around the axis as a central axis through the at least one first elastic component, and the rotating rotatable element is linked to the sensing structure through the at least one second elastic component to be correspondingly deformed, and outputs a sensing signal through the sensing electrode, wherein the at least one first elastic component is directly connected to the rotatable element, the at least one second elastic component is directly connected to the rotatable element, the at least one first elastic component is not directly connected to the rotating shaft structure, and the at least one second elastic component is not directly connected to the rotating shaft structure.

2. The piezoelectric actuating apparatus according to claim 1, further comprising a driving circuit and a sensing circuit, wherein the driving circuit is coupled to the driving electrode to provide the driving signal, and the sensing circuit is coupled to the sensing electrode to receive the sensing signal.

3. The piezoelectric actuating apparatus according to claim 1, wherein the rotatable element has a first side and a second side opposite to each other along an axial direction of the axis, the rotating shaft structure comprises a first portion and a second portion, the first portion is connected to the first side of the rotatable element, and the second portion is connected to the second side of the rotatable element.

4. The piezoelectric actuating apparatus according to claim 3, wherein the at least one first elastic component comprises two first elastic components respectively disposed on the first side and the second side of the rotatable element, and the at least one second elastic component comprises two second elastic components respectively disposed on the first side and the second side of the rotatable element.

5. The piezoelectric actuating apparatus according to claim 4, wherein the actuating structure comprises a first actuating arm and a second actuating arm respectively disposed on the first side and the second side of the rotatable element and structurally separated from each other, and the first actuating arm and the second actuating arm are elastically coupled to the rotatable element through the two first elastic components, respectively.

6. The piezoelectric actuating apparatus according to claim 5, wherein the sensing structure comprises a first sensing arm and a second sensing arm respectively disposed on the first side and the second side of the rotatable element and structurally separated from each other, and the first sensing arm and the second sensing arm are elastically coupled to the rotatable element through the two second elastic components, respectively.

7. The piezoelectric actuating apparatus according to claim 1, further comprising a reflection layer disposed on a first surface of the rotatable element.

8. The piezoelectric actuating apparatus according to claim 7, wherein a reinforced structure is disposed on a second surface of the rotatable element.

9. The piezoelectric actuating apparatus according to claim 8, wherein the reinforced structure of the rotatable element is an annular structure surrounding an edge of the rotatable element.

10. The piezoelectric actuating apparatus according to claim 1, wherein the actuating body of the actuating structure, the sensing body of the sensing structure, the rotating shaft structure, the at least one first elastic component, the at least one second elastic component, and the rotatable element are integrally formed.

11. The piezoelectric actuating apparatus according to claim 1, wherein the actuating structure and the sensing structure are respectively half-moon or semi-circular.

12. A piezoelectric actuating apparatus, comprising a frame, a rotatable element, an actuating structure, and a sensing structure, wherein
the frame has an accommodating opening and a first side and a second side that define the accommodating opening and are opposite to each other;
the rotatable element is disposed in the accommodating opening and connected to the frame through a rotating shaft structure, the rotating shaft structure has an axis, and the rotatable element is configured to reciprocatingly swing relative to the frame around the axis as a center;
the actuating structure extends from the first side of the frame and is located between the rotatable element and the first side of the frame, the actuating structure is elastically coupled to the rotatable element through at least one first elastic component, the actuating structure has an actuating body, a first piezoelectric material layer, and a driving electrode disposed on a side of the first piezoelectric material layer, and the first piezoelectric material layer is disposed on the actuating body; and
the sensing structure extends from the second side of the frame and is located between the rotatable element and the second side, the sensing structure is elastically coupled to the rotatable element through at least one second elastic component, the sensing structure has a sensing body, a second piezoelectric material layer, and a sensing electrode disposed on a side of the second piezoelectric material layer, the second piezoelectric material layer is disposed on the sensing body, and the at least one first elastic component and the at least one second elastic component are respectively disposed on two opposite sides of the axis,
wherein the actuating structure is deformed by receiving a driving signal through the driving electrode, and drives the rotatable element to rotate around the axis as a central axis through the at least one first elastic component, and the rotating rotatable element is linked to the sensing structure through the at least one second elastic component to be correspondingly deformed, and outputs a sensing signal through the sensing electrode,
wherein the rotatable element has a first side and a second side opposite to each other along an axial direction of the axis, the rotating shaft structure comprises a first portion and a second portion, the first portion is connected to the first side of the rotatable element, and the second portion is connected to the second side of the rotatable element,
wherein the frame further has a third side and a fourth side that define the accommodating opening and are opposite to each other, the third side and the fourth side connect with the first side and the second side, the first portion of the rotating shaft structure is further connected to the third side of the frame, and the second portion of the rotating shaft structure is further connected to the fourth side of the frame.

13. The piezoelectric actuating apparatus according to claim 12, wherein a width of the first portion in an extending direction along the third side is gradually increased from the rotatable element toward the third side of the frame, and a width of the second portion in an extending direction along the fourth side is gradually increased from the rotatable element toward the fourth side of the frame.

14. The piezoelectric actuating apparatus according to claim 13, wherein the rotatable element is provided with two slots respectively in two regions adjacent to the first portion and the second portion of the rotating shaft structure, and the two slots are located on the axis of the rotating shaft structure.

15. The piezoelectric actuating apparatus according to claim 13, wherein a connection between the first portion of the rotating shaft structure and the frame is provided with a slot, and a connection between the second portion and the frame is provided with another slot.

16. The piezoelectric actuating apparatus according to claim 13, wherein the frame is provided with two slots in two regions adjacent to the first portion and the second portion of the rotating shaft structure, and the two slots are located on the axis of the rotating shaft structure.

* * * * *